(12) United States Patent
Shih (10) Patent No.: US 11,194,474 B1
(45) Date of Patent: *Dec. 7, 2021

(54) LINK-LIST SHORTENING LOGIC

(71) Applicant: Ambarella International LP, Santa Clara, CA (US)

(72) Inventor: Yen-Hsu Shih, Zhubei (TW)

(73) Assignee: Christopher P. Maiorana, PC, Ambarella International, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,236

(22) Filed: Mar. 30, 2020

Related U.S. Application Data (63) Continuation of application No. 15/591,530, filed on May 10, 2017, now Pat. No. 10,649,666.

(51) Int. Cl.
*G06F 3/06* (2006.01)
*H03K 19/173* (2006.01)
*H03K 19/00* (2006.01)

(52) U.S. Cl.
CPC .......... *G06F 3/0611* (2013.01); *G06F 3/0655* (2013.01); *G06F 3/0673* (2013.01); *H03K 19/0008* (2013.01); *H03K 19/1737* (2013.01)

(58) Field of Classification Search
CPC .... G06F 3/0611; G06F 3/0673; G06F 3/0655; H03K 19/0008; H03K 19/1737
USPC ......... 711/202, 117, 154, E12.003, E12.016; 707/694
See application file for complete search history.

(56) References Cited

U.S. PATENT DOCUMENTS

| | | | | |
|---|---|---|---|---|
| 4,866,706 A | * | 9/1989 | Christophersen | H04L 12/417 370/400 |
| 7,672,022 B1 | * | 3/2010 | Fan | G06T 5/20 358/474 |
| 2003/0101307 A1 | * | 5/2003 | Gemelli | G06F 30/30 710/305 |
| 2009/0063556 A1 | * | 3/2009 | Nemoto | G06F 16/119 |
| 2016/0360546 A1 | * | 12/2016 | Kandhalu Raghu | H04W 74/0808 |
| 2017/0308466 A1 | * | 10/2017 | Hakimi | G06F 12/084 |

* cited by examiner

*Primary Examiner* — Tuan V Thai
*Assistant Examiner* — Edward Waddy, Jr.
(74) *Attorney, Agent, or Firm* — Christopher P. Maiorana, PC (57) ABSTRACT

An apparatus includes a first circuit and a second circuit. The first circuit may be configured to traverse a link list of connected components forming an object in an image being processed in a machine vision system. The link list may comprise object IDs and link pointers for each component of the object. The link pointers generally identify links between each component from a current leaf component to a root component of the object. Each of the connected components may comprise one or more pixels of the image belonging to the object. The second circuit may be configured to modify at least the link pointer associated with the current leaf component to point to the root component instead of a next component between the current leaf component and the root component by generating a control signal to control replacement of at least an object ID of a next connected leaf component in the link pointer of the current leaf component with the object ID of the root component.

18 Claims, 8 Drawing Sheets

LINK-LIST SHORTENING LOGIC

This application relates to U.S. Ser. No. 15/591,530, filed May 10, 2017, which is hereby incorporated by reference in its entirety.

FIELD OF THE INVENTION

The invention relates to image processing and computer vision generally and, more particularly, to a method and/or apparatus for implementing link-list shortening logic.

BACKGROUND

Connected component labeling is an operation frequently used in image processing and computer vision applications to distinguish objects in a picture. Unlike human vision, a picture is "seen" by computer vision (or machine vision) in raster-scan order. In an example of a picture with a "U"-shaped object, since the picture is processed in raster-scan order, the machine will treat the left and right branches of the "U"-shaped object as two objects until the machine reaches the bottom of the "U"-shaped object. The machine then realizes the two branches actually belong to one object.

In implementations of connected component labeling, the two objects corresponding to the two branches are connected (merged) by creating a link between them in a component table. Images can contain many objects. Thus, a large component table may be needed to store information about each object, including a link-pointer indicating whether an object is merged to another object.

It would be desirable to implement link-list shortening logic.

SUMMARY

The invention concerns an apparatus including a first circuit and a second circuit. The first circuit may be configured to traverse a link list of connected components forming an object in an image being processed in a machine vision system. The link list may comprise object IDs and link pointers for each component of the object. The link pointers generally identify links between each component from a current leaf component to a root component of the object. Each of the connected components may comprise one or more pixels of the image belonging to the object. The second circuit may be configured to modify at least the link pointer associated with the current leaf component to point to the root component instead of a next component between the current leaf component and the root component by generating a control signal to control replacement of at least an object ID of a next connected leaf component in the link pointer of the current leaf component with the object ID of the root component.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing link-list shortening logic that may (i) be used with a connected component labeling process, (ii) modify link pointers in a component table, (iii) reduce latency for identifying a root component, (iv) be implemented solely in hardware, (v) link components of an object directly to a root component, and/or (vi) be implemented as one or more integrated circuits.

Figure 1:
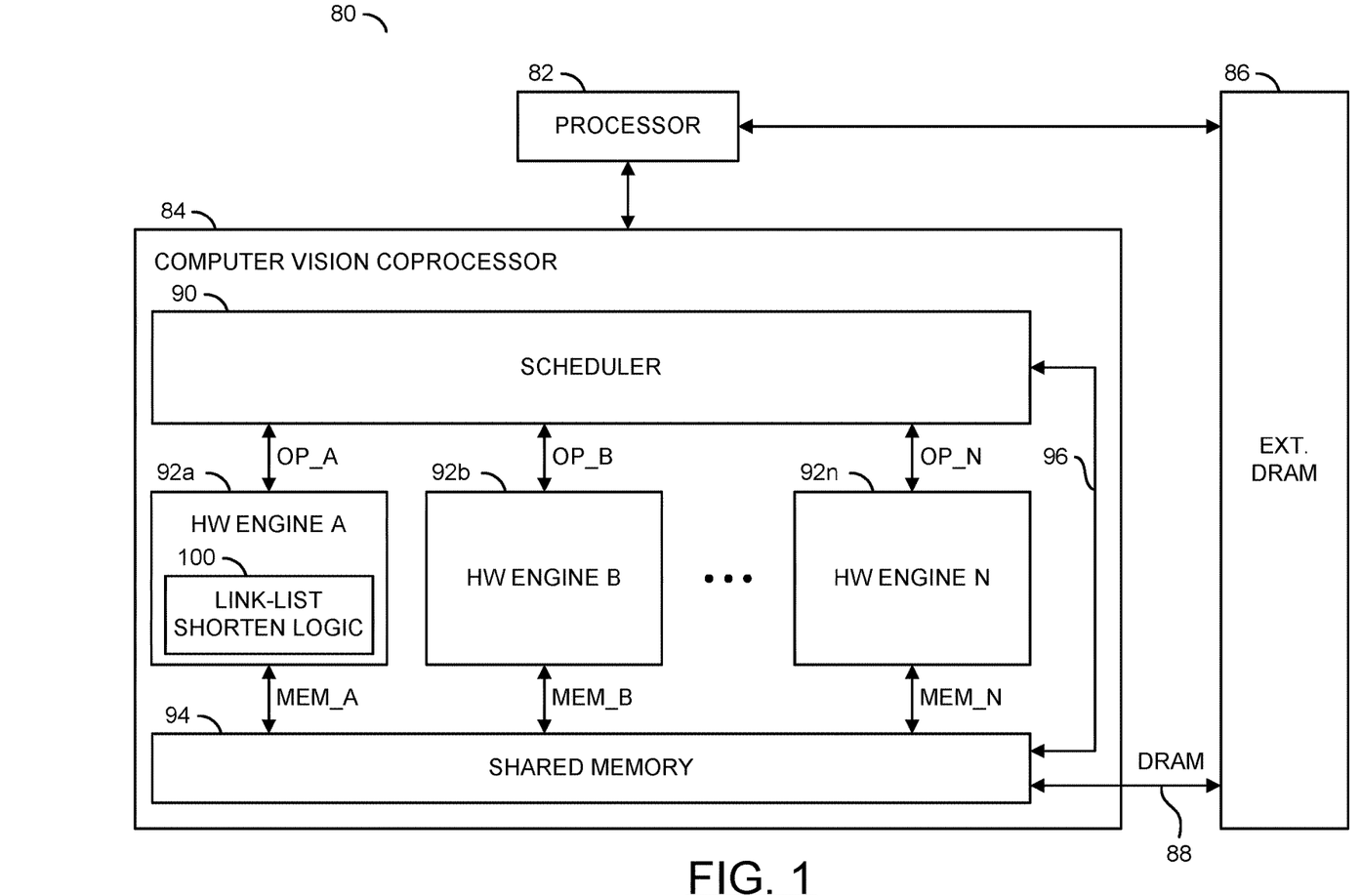
FIG. 1 is a diagram illustrating a context in which link-list shortening logic in accordance with an embodiment of the invention may be implemented.

Referring to FIG. 1, a diagram of a system 80 is shown illustrating a context in which a link-list shortening logic for connected component labeling in accordance with an example embodiment of the invention may be implemented. The system (or apparatus) 80 may be implemented as part of a computer vision system. In various embodiments, the system 80 may be implemented as part of a camera, a computer, a server (e.g., a cloud server), a smart phone (e.g., a cellular telephone), a personal digital assistant, or the like. The system 80 may be configured for applications including, but not limited to autonomous and semi-autonomous vehicles (e.g., cars, trucks, agricultural machinery, drones, etc.), manufacturing, and/or security/surveillance systems. In contrast to a general purpose computer, the system 80 generally comprises hardware circuitry that is optimized to provide a high performance image processing and computer vision pipeline in minimal area and with minimal power consumption.

In an example embodiment, the system 80 generally comprises a block (or circuit) 82, a block (or circuit) 84, a block (or circuit) 86 and a memory bus 88. The circuit 84 generally comprises a block (or circuit) 90, one or more blocks (or circuits) 92a-92n, a block (or circuit) 94 and a path 96. One or more of the circuits 92a-92n may include a block (or circuit) 100.

Multiple signals (e.g., OP A to OP N) may be exchanged between the circuit 90 and the respective circuits 92a-92n. Each signal OP A to OP N may convey execution operation information and/or yield operation information. Multiple signals (e.g., MEM A to MEM N) may be exchanged between the respective circuits 92a-92n and the circuit 94. The signals MEM A to MEM N may carry data. A signal (e.g., DRAM) may be exchanged between the circuit 86 and the circuit 94. The signal DRAM may transfer data between the circuits 86 and 94.

The circuit 82 may implement a processor circuit. In some embodiments, the processor circuit 82 may be a general purpose processor circuit. The processor circuit 82 may be operational to interact with the circuit 84 and the circuit 86 to perform various processing tasks.

The circuit 84 may implement a coprocessor circuit. The coprocessor circuit 84 is generally operational to perform specific (e.g., computer vision related) processing tasks as arranged by the processor circuit 82. In various embodiments, the coprocessor 84 may be implemented solely in hardware. The coprocessor 84 may directly execute a data flow directed to object extraction, including a link-list shortening logic for connected component labeling, generated by software that specifies processing tasks.

The circuit 86 may implement a dynamic random access memory (DRAM) circuit. The DRAM circuit 86 is generally operational to store multidimensional arrays of input data elements and various forms of output data elements. The DRAM circuit 86 may exchange the input data elements and the output data elements with the processor circuit 82 and the coprocessor circuit 84.

The circuit 90 may implement a scheduler circuit. The scheduler circuit 90 is generally operational to schedule tasks among the circuits 92a-92n to perform a variety of computer vision tasks as defined by the processor circuit 82. Individual tasks may be allocated by the scheduler circuit 90 to the circuits 92a-92n. The scheduler circuit 90 may time multiplex the tasks to the circuits 92a-92n based on the availability of the circuits 92a-92n to perform the work.

Each circuit 92a-92n may implement a processing resource (or hardware engine). The hardware engines 92a-92n are generally operational to perform specific processing tasks. In some configurations, the hardware engines 92a-92n may operate in parallel and independently of each other. In other configurations, all or a portion of the hardware engines 92a-92n may operate collectively to perform allocated tasks. The hardware engines 92a-92n may be implemented as one or more of homogenous processing resources (e.g., all circuits 92a-92n may have the same capabilities) or heterogeneous processing resources (e.g., two or more circuits 92a-92n may have different capabilities). In various embodiments, the circuits 92a-92n may implement one or more operators. The operators performed by the hardware engines 92a-92n may include, but are not limited to, a warping operator, component operators that manipulate lists of components (e.g., components may be regions of a vector or array that share a common attribute and may be grouped together with a bounding box), a matrix inversion operator, a dot product operator, a convolution operator, conditional operators (e.g., multiplex and demultiplex), a remapping operator, a minimum-maximum-reduction operator, a pooling operator, a non-minimum, non-maximum suppression operator, a link-list shortening logic, a gather operator, a scatter operator, a statistics operator, a classifier operator, an integral image operator, comparison operators, indexing operators, a pattern matching operator, a feature extraction operator, a feature detection operator, an object detection operator, a score generating operator, and an upsample operator. In various embodiments, the hardware engines 92a-92n may be implemented solely as hardware circuits.

The circuit 94 may implement a shared memory circuit. The shared memory 94 is generally operational to store all, a portion, or portions of the multidimensional arrays (or vectors) of input data elements and output data elements utilized and/or generated by the hardware engines 92a-92n. The input data elements may be received from the DRAM circuit 86 via the memory bus 88. The output data elements may be sent to the DRAM circuit 86 via the memory bus 88.

The path 96 may implement a transfer path internal to the coprocessor 84. The transfer path 96 is generally operational to move data from the scheduler circuit 90 to the shared memory 94. The transfer path 96 may also be operational to move data from the shared memory 94 to the scheduler circuit 90.

The circuit 100 may implement a link-list shortening logic in accordance with an example embodiment of the invention. In various embodiments, the circuit 100 may be configured to perform a link-list shortening operation for a connected component labeling process in accordance with the invention. In various embodiments, the link-list shortening operation for connected component labeling may be implemented according to the following implementation descriptions.

Connected component operations are frequently used in image processing and computer vision applications. In general, multiple components may be merged together during connected component labeling to form a single object. A link-list is generally utilized to keep track of which components detected in an image are actually part of the same object. The link-list is generally maintained in a component table. The longer the link-list is, the greater the time (latency) needed to find the root component of the object. The link-list shortening logic 100 is generally configured to modify the link-list to reduce the time (latency) to traverse the link-list to find the root component. Shortening the link-list reduces the access time each time the object is subsequently looked up.

Figure 2:
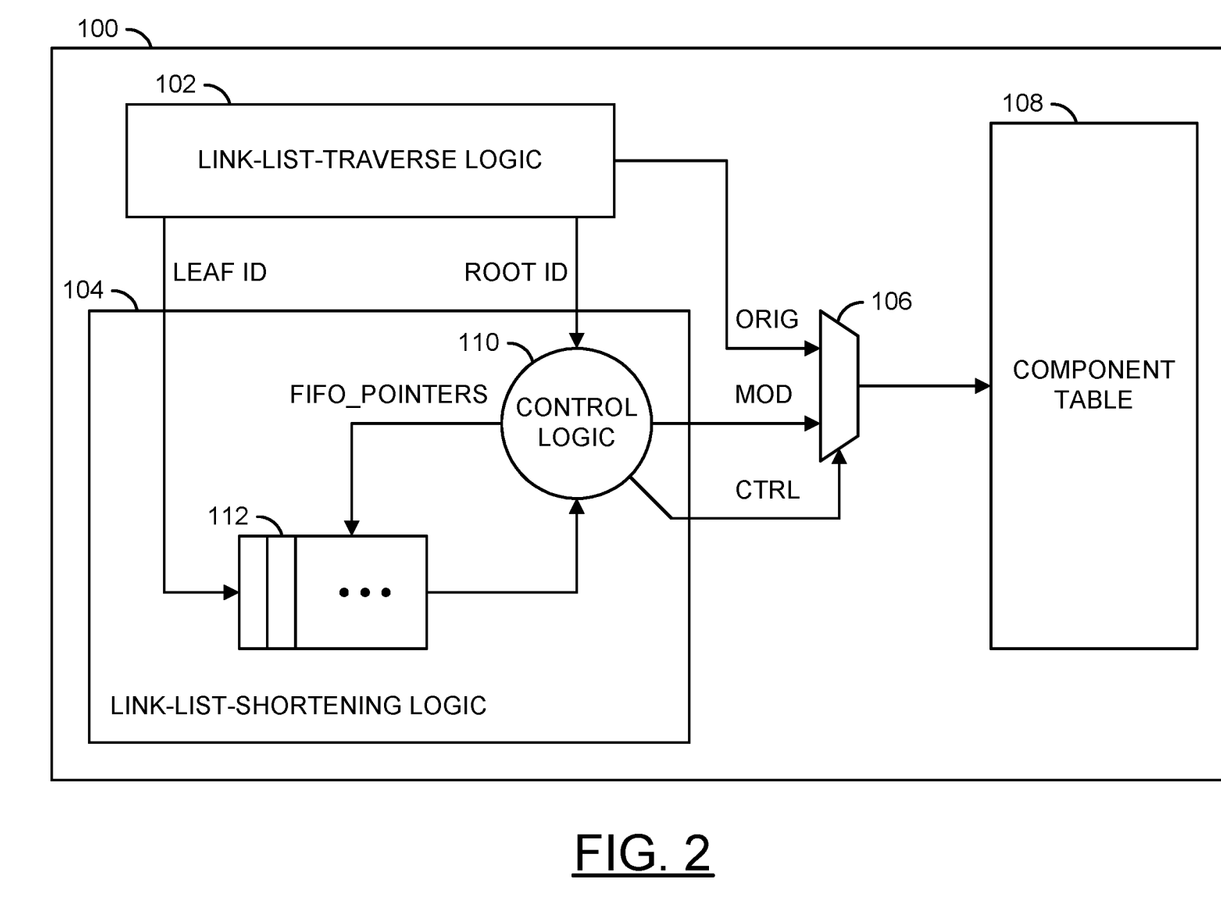
FIG. 2 is a diagram illustrating an example hardware implementation of the link-list shortening logic of FIG. 1.

Referring to FIG. 2, a diagram is shown illustrating an example hardware implementation of the link-list shortening logic 100 of FIG. 1. In an example embodiment, the logic (or block or circuit) 100 may comprise a block (or circuit) 102, a block (or circuit) 104, a block (or circuit) 106, and a block (or circuit) 108. The circuit 102 may implement a link-list-traversal logic. The circuit 104 may implement a link list shortening logic. The circuit 106 may implement a multiplexer circuit. The circuit 108 may implement (store) a component table.

The circuit 102 may have a first output that may present a signal (e.g., LEAF_ID), a second output that may present a signal (e.g., ROOT_ID), and a third output that may present a signal (e.g., ORIG). The signal LEAF_ID may comprise an object identification number (object ID) of the current leaf component and a link pointer for the current leaf component. The link pointer generally contains the object ID of the next leaf component associated with a current object. The signal ROOT_ID may comprise an object identification number (object ID) of the root component and a link pointer for the root component. The link pointer of the root component contains the object ID of the root component itself. The signal ORIG is generally configured to communicate original (unmodified) information of the link-list being traversed by the circuit 102.

The circuit 104 may have a first input that may receive the signal LEAF_ID, a second input that may receive the signal ROOT_ID, a first output that may present a signal (e.g., MOD), and a second output that may present a signal (e.g., CTRL). The signal MOD may comprise modified information generated by the circuit 104 about the link-list being traversed by the circuit 102. The signal CTRL may be used to select between the original (unmodified) information of the link-list and the modified information provided at the first output of the circuit 104. The modified information generated by the circuit 104 may be used to shorten the link-list (e.g., alter one or more link pointers to point to the root component) to reduce link-list access latency. The circuit 106 may have a first data input that may receive the signal ORIG, a second data input that may receive the signal MOD, a control input that may receive the signal CTRL, and an output that may present data for entry into the component table 108. In various embodiments, the component table 108 may be modified by the circuit 104 in accordance with an example embodiment of the invention to reduce link-list access latency.

In an example, the circuit 104 may comprise a block (or circuit) 110 and a block (or circuit) 112. The circuit 110 may implement a control logic. The circuit 112 may implement a first-in-first-out (FIFO) memory configured to store information for the linked list being traversed by the circuit 102. The circuit 110 may have a first input that may receive the signal ROOT_ID, a first output that may present one or more control signals (e.g., FIFO_POINTERS), a second input that may receive an output of the circuit 112, a second output that may present the signal MOD, and a third output that may present the signal CTRL. The circuit 112 may have an input that may receive the signal LEAF_ID, an input that may receive the control signals FIFO_POINTERS, and an output that may present a signal to the second input of the circuit 110. In an example, the signals FIFO_POINTERS may comprise read and write pointers for controlling operation of the circuit 112. Whenever the control logic 110 decides to modify the link list, the control logic 110 asserts the signal CTRL, and in the meantime stops the circuit 102 from driving any further access to the component table 108.

The circuit 102 is generally configured to traverse a list of connected components forming an object. The list comprises object IDs and link pointers for each component of the object. The link pointers identify links from a current leaf component to a root component of the object. In some embodiments, the circuit 104 may be configured to modify less than all of the link pointers of the list of connected components of the object. In an example, the circuit 104 may be configured to modify at least two of the link pointers starting with the current leaf component of the list being traversed. The circuit 104 is generally configured to modify at least the link pointer associated with the current leaf component to point to the root component.

In some embodiments, the list of connected components is generated during application of a connected component labeling technique to a captured image. In an example, the image may be a frame of a video sequence. The reduction in latency provided by the link-list shortening logic in accordance with an embodiment of the invention may facilitate real-time image analysis and/or computer vision applications applied to unmanned aerial vehicles (e.g., drones, etc.), autonomous vehicles, and other applications where lower latency in accessing object data may be advantageous.

During a connected component labeling operation, the shape of an object being labeled can be complex, the link-list for certain objects may be very long. In an example of a "W"-shaped object, three labels would be needed to tag the three branches of the "W". Assuming the object labels (IDs) used for the three branches are #1, #2, and #3, respectively, once the bottom of the "W" is reached, the branches may be merged by creating two links (e.g., #1->#2, #2->#3). Without link-list shortening in accordance with embodiments of the invention, looking up the information of the object #1 takes two steps to find out that the object #1 actually belongs to the object #3. The link-list shortening logic in accordance with embodiments of the invention generally reduces the latency to find out the root of an object. In the above example, the link of #1->#2 is modified as #1->#3 after the look-up operation. Because only the identity of the root component of an object is generally needed, losing information about the midpoint(s) generally does not cause a problem as long as the root component can be found from the leaf component(s).

Figure 3:
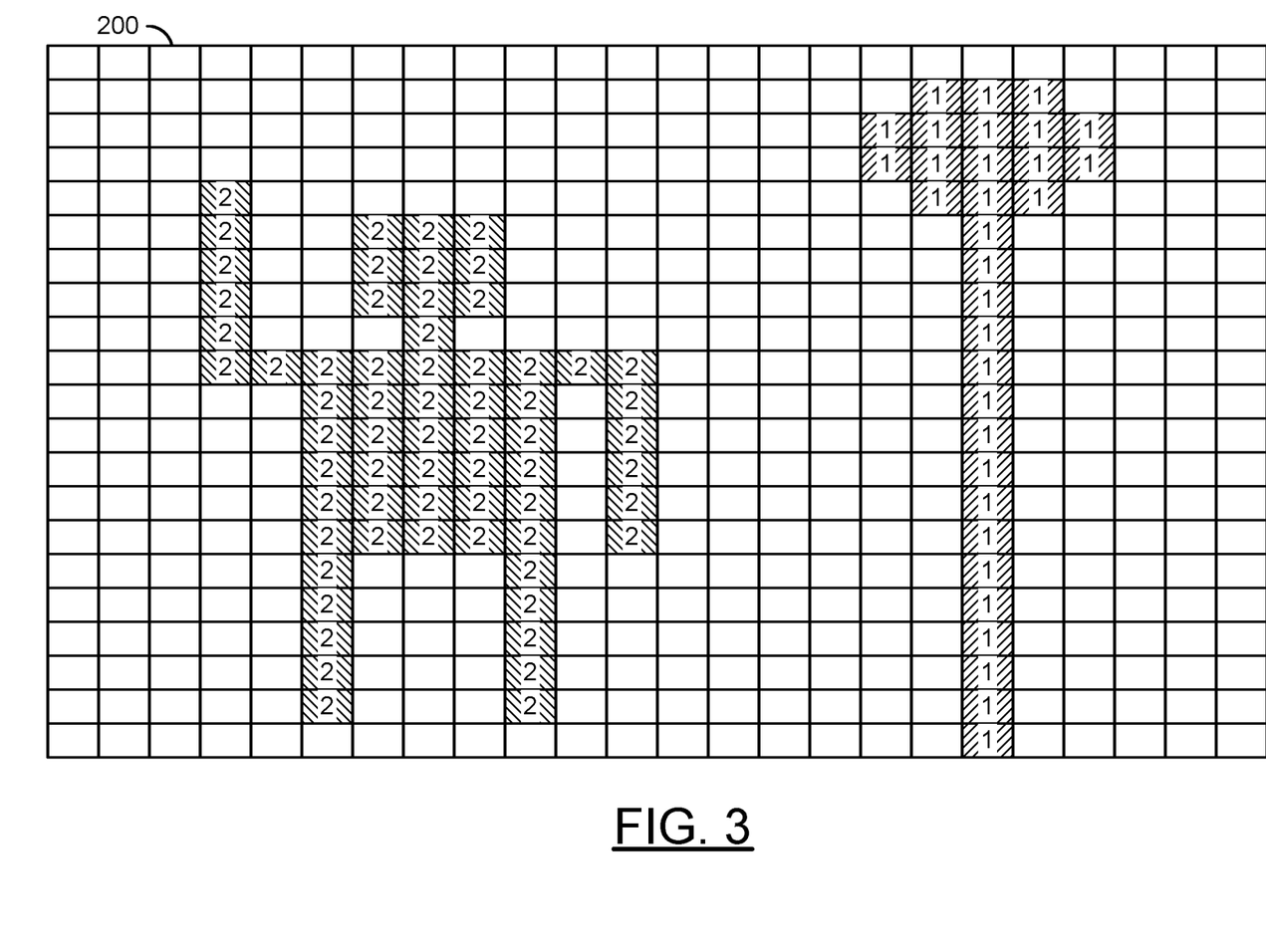
FIG. 3 is a diagram illustrating an image containing two objects made up of merged components.

Referring to FIG. 3, a diagram of an image 200 is shown illustrating two objects (labeled #1 and #2) made up of merged components. In an example, a two-pass connected component labeling technique may be used to label the two objects in the image 200. The two-pass technique generally iterates through 2-dimensional, binary data (e.g., making two passes over the image 200). In a first pass, temporary labels may be assigned and equivalences recorded. In a second pass, the temporary labels may be replaced by a label uniquely representing the equivalent class (or object). In an example, the labeling may be maintained in a separate data structure (e.g., a component table).

Figure 4:
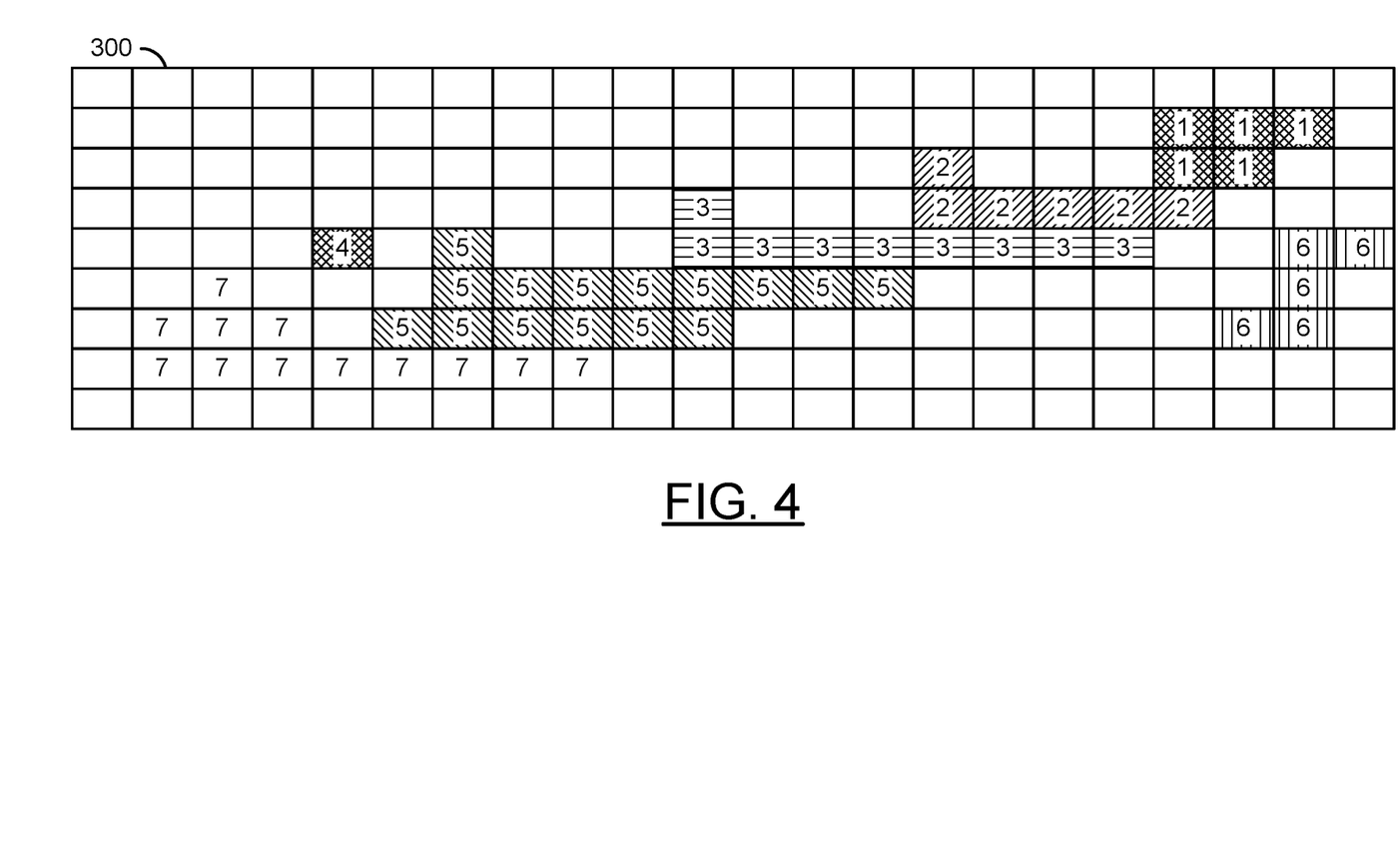
FIG. 4 is a diagram illustrating a portion of an image containing an object having numerous connected-component labels.

Referring to FIG. 4, a diagram is shown illustrating a portion 300 of an image containing an object having numerous connected-component labels. In the first pass of applying the two-pass connected component labeling technique, the image portion 300 is processed in raster-scan order and components are assigned labels in the order of detection. In the example illustrated in FIG. 4, seven components are detected based on a predefined criteria (e.g., foreground vs. background, etc.) and labeled based upon detection order (e.g., #1, #2, #3, #4, #5, #6, and #7). During the first pass, a list of label equivalents (or objects) may also be generated, as illustrated in the following Table 1:

TABLE 1

| Object ID | Equivalent Labels |
|---|---|
| 1 | 1, 2, 3, 5, 7 |
| 2 | 1, 2, 3, 5, 7 |
| 3 | 1, 2, 3, 5, 7 |
| 4 | 4 |
| 5 | 1, 2, 3, 5, 7 |
| 6 | 6 |
| 7 | 1, 2, 3, 5, 7 |

In the example image portion 300, the components with labels #1, #2, #3, and #5 may be referred to as leaf components, and the component labeled #7 may be referred to as a root component. In general, the link-list shortening logic 100 may be useful during the various operations making up the connected component labeling process. During the first pass, the link-list traversal logic 102 may be used by operations that need to determine the root of an object. In an example, an operation to filter small components (e.g., to remove noise) may be performed during the first pass. A determination of whether an object is small would generally involve traversing the link-list for the object (e.g., to determine the extent of the object) prior to comparison with some criteria related to size.

During the second pass, the components may be merged based on predetermined criteria related to forming objects. In an example, when root component #7 is identified, the leaf components may be merged by creating links (e.g., #1->#2, #2->#3, #3->#5, and #5->#7). Once the leaf and root components have been identified and the links created, a link-list shortening logic in accordance with an embodiment of the invention may be applied to reduce the latency in finding the root component when a leaf component is accessed. In general, application of the link list shortening logic is not limited to any particular pass in a connected component labeling operation.

Figure 5:
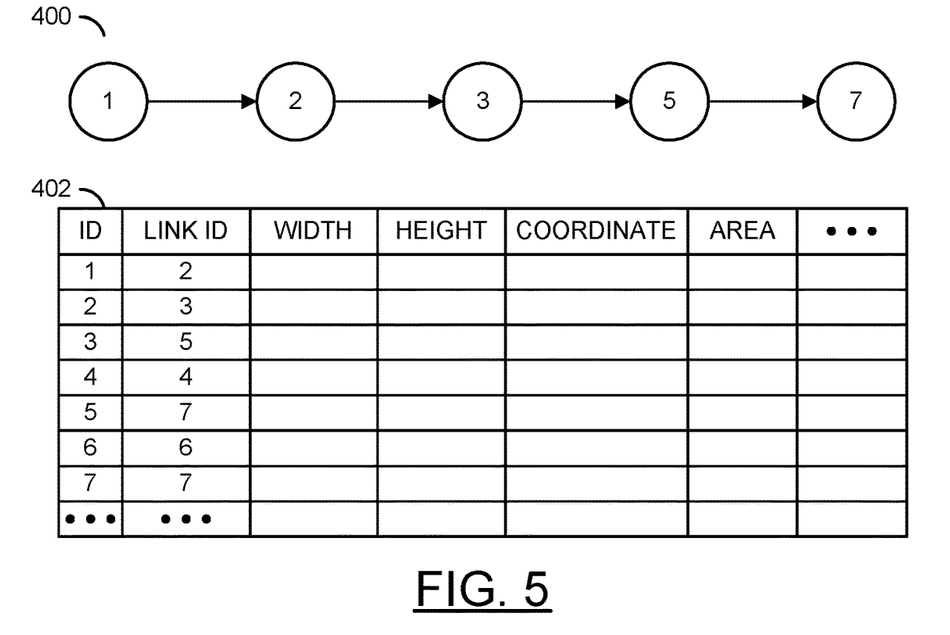
FIG. 5 is a diagram illustrating an example link-list and component table for the image portion of FIG. 4.

Referring to FIG. 5, a diagram is shown illustrating an example connected component graph 400 and an example component table 402 for the image portion 300 of FIG. 4. The connected component graph 400 generally illustrates the related components of the image portion 300 as circles containing the respective object ID and arrows representing the links applied during the merge process. In the example component table 402, a first column contains the object IDs and a second column is shown containing link pointers. The link pointer entries contain the object ID of the subsequently identified component that the merge process linked to the component whose label is in the corresponding entry in the object ID column. The component table 402 may be configured to store additional information about each component. In an example, the additional information may include, but is not limited to width, height, coordinate, and area. However, other information about each component may be stored accordingly to meet the design criteria of a particular implementation.

Figure 6:
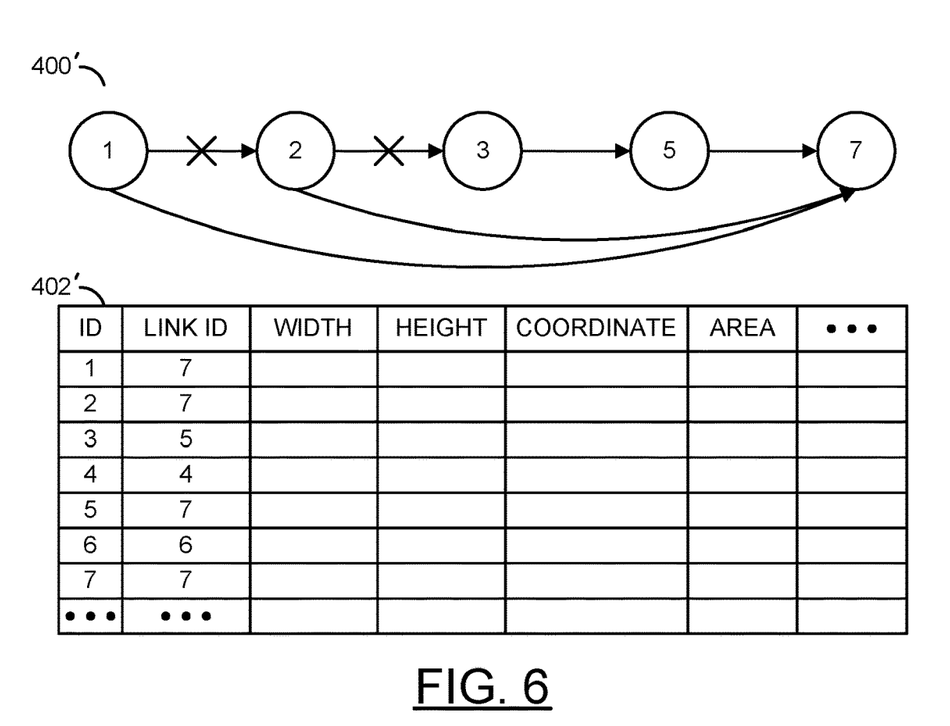
FIG. 6 is a diagram illustrating an example shortened link-list and component table for the image portion of FIG. 4.

Referring to FIG. 6, a diagram is shown illustrating an example shortened version of the connected component graph 400 and an example modified version of the component table 402 of FIG. 5. In an example where the link list shortening logic 100 is configured to modify two links, a shortened connected component graph 400' generally illustrates the links #1->#2 and #2->#3 replaced by links #1->#7 and #2->#7. A component table 402' generally illustrates the corresponding modifications made to the component table 402 by the link list shortening logic 100. In particular, the link pointer entries corresponding to the object IDs #1 and #2 are replaced by the object ID of the root component (#7).

The link list shortening logic 100 in accordance with embodiments of the invention generally modifies the link list starting with the currently accessed leaf component. Thus, if the current leaf component is #3, a link list shortening logic configured to modify two links would only replace the link #3->#5 with a link #3->#7 because the link pointer for leaf component #5 is already pointing to the root component #7. In general, when the link list shortening logic 100 traverses a number of leaf links and then finds the corresponding root, the link list shortening logic 100 may be configured to modify the link-ID of one or multiple leaves. In an example, the number of leaves may be configurable (programmed) depending upon the memory resources available. Ideally, all leaves of the link list may be modified at one time, but the hardware cost may be huge. Thus, the number of leaves modified may be balanced with the corresponding hardware costs to meet the design criteria of a particular implementation.

Figure 7:
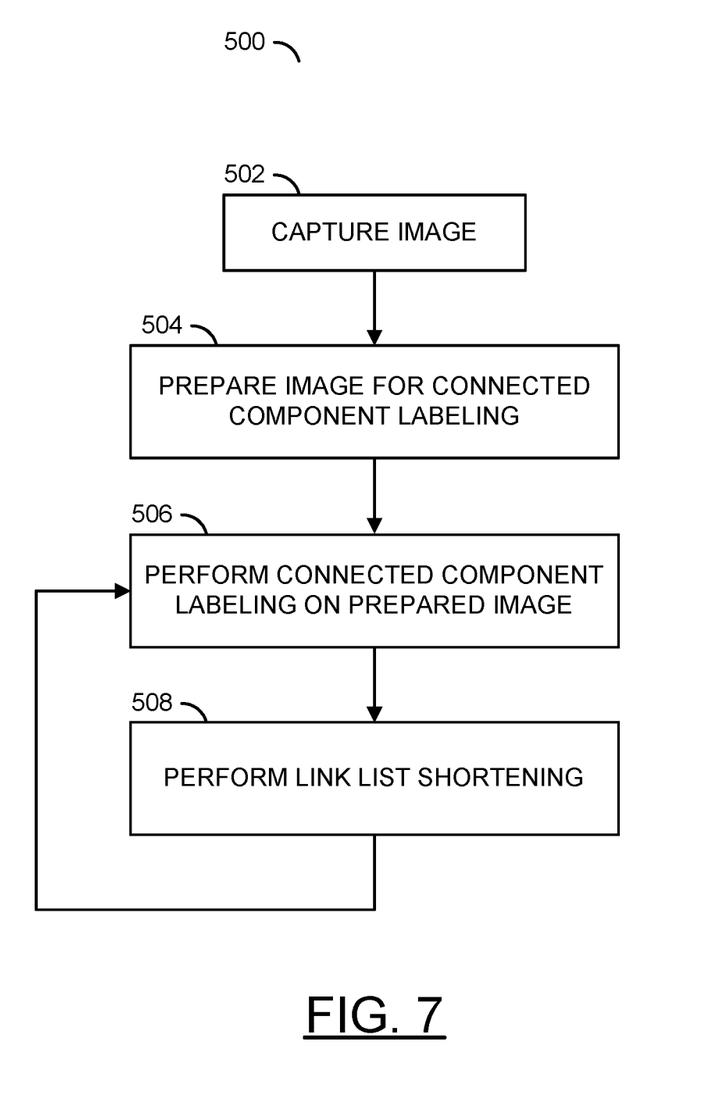
FIG. 7 is a diagram illustrating a process for connected component labeling with link-list shortening in accordance with an example embodiment of the invention.

Referring to FIG. 7, a diagram of a process 500 is shown illustrating connected component labeling with link-list shortening in accordance with an example embodiment of the invention. In an example, a process (or method) 500 may comprise a step (or state) 502, a step (or state) 504, a step (or state) 506, and a step (or state) 508. In the step 502, the process 500 may capture an image. In the step 504, the process 500 may prepare the captured image for input to a connected component labeling process. In an example, the step 504 may convert the captured image to a binary image (e.g., containing picture elements having one of two types, foreground or background). In another example, a separate binary image might be generated for use as a mask to identify the picture elements (pixels) in the captured image belonging to particular objects. In the step 506, the process 500 may perform connected component labeling on the prepared image from the step 504. In the step 508, the process 500 may perform a link list shortening operation in accordance with an example embodiment of the invention. The steps 506 and 508 may be performed repeatedly (e.g., until some predetermined criteria is met).

Figure 8:
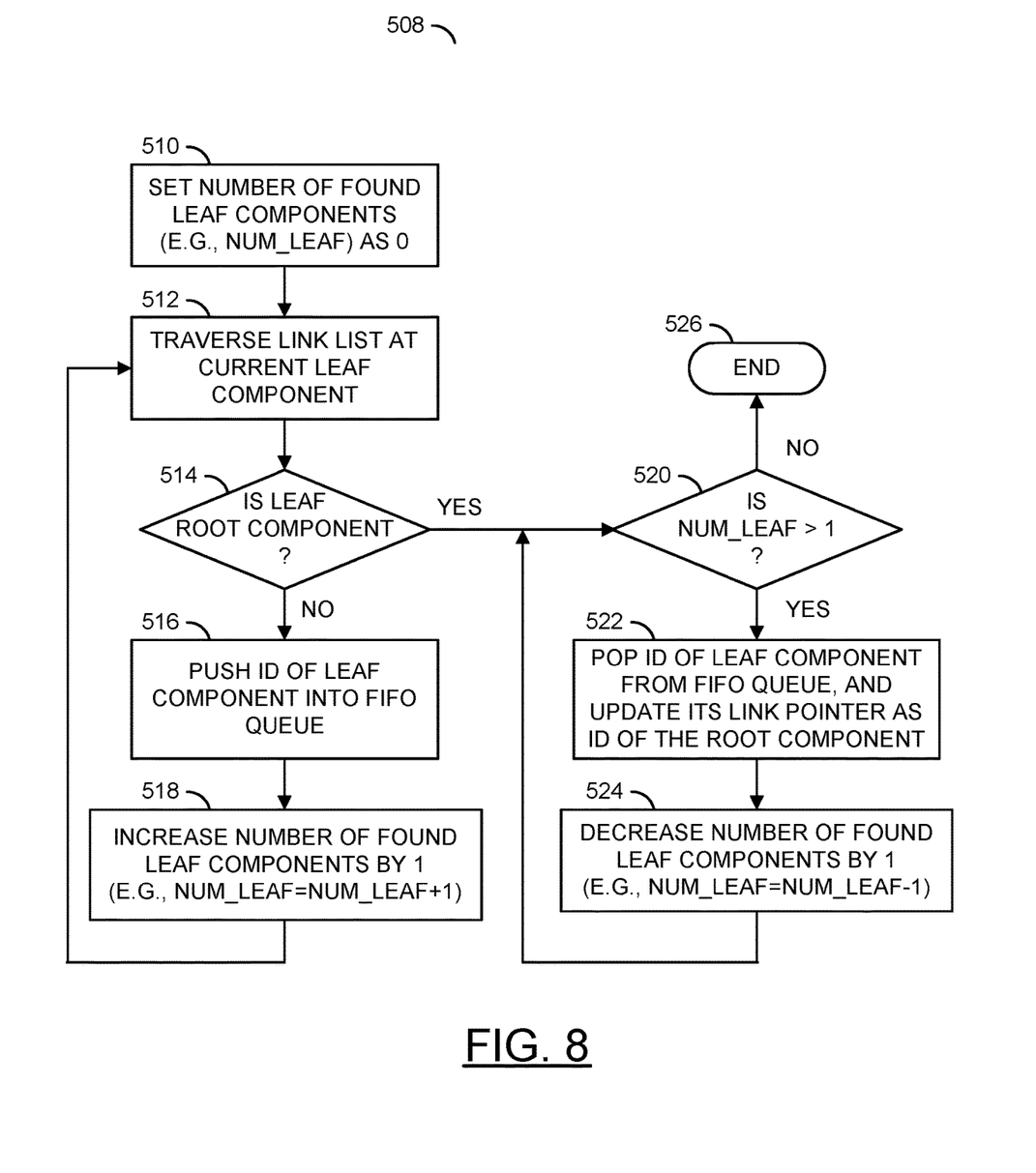
FIG. 8 is a diagram illustrating a process for link-list shortening in accordance with an example embodiment of the invention.

Referring to FIG. 8, a diagram is shown illustrating a link-list shortening process in accordance with an example embodiment of the invention. In an example, the step 508 of the process 500 may comprise a step (or state) 510, a step (or state) 512, a step (or state) 514, a step (or state) 516, a step (or state) 518, a step (or state) 520, a step (or state) 522, a step (or state) 524, and a step (or state) 526. In an example embodiment, the steps 510 through 526 may be performed solely in hardware.

In the step 510, the process 500 may set a variable representing number of found leaf components (e.g., NUM_LEAF) to a value of zero. In the step 512, the process 500 may traverse the link list starting at a current leaf component. In the step 514, the process 500 may determine whether the current component is a root component. If the current component is not a root component, the process 500 may move to the step 516. In the step 516, the process 500 pushes the ID of the current leaf component into the FIFO memory 112. In the step 518, the process 500 increments the number of found leaf components by 1 (e.g., NUM_LEAF=NUM_LEAF+1) and returns to the step 512. When the current leaf component is determined to be a root component in the step 514, the process 500 may move to the step 520.

In the step 520, the process 500 determines whether the number of found leaf components is greater than 1. If the number of found leaf components is greater than 1, the process 500 moves to the step 522. In the step 522, the process 500 pops an ID of a queued leaf component from the FIFO memory 112 and updates a corresponding link pointer with the ID of the root component (e.g., ROOT_ID). The process 500 then moves to the step 524. In the step 524, the process 500 decreases the number of found leaf components by 1 (e.g., NUM_LEAF=NUM_LEAF−1) and returns to the step 520. In the step 520, when the number of found leaf components is not greater than 1, the process 500 moves to the step 526. In the step 526, the process 500 terminates the link list shortening process 508 and returns to the step 506.

Figure 9:
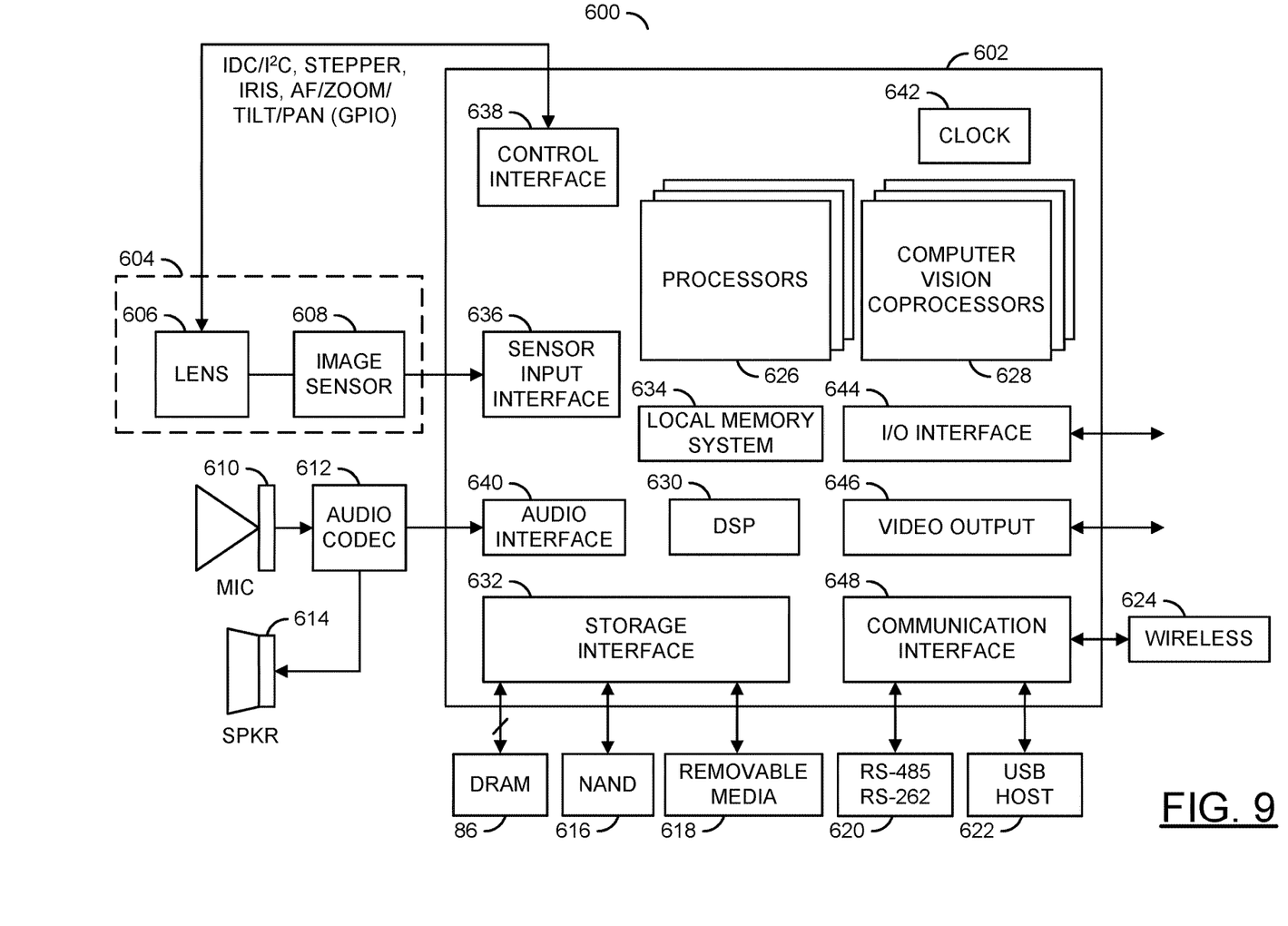
FIG. 9 is a diagram illustrating a camera system incorporating a link-list shortening logic for connected component labeling in accordance with an example embodiment of the invention.

Referring to FIG. 9, a diagram of a camera system 600 is shown illustrating an example implementation of a system incorporating a link-list shortening logic in accordance with an example embodiment of the present invention. In an example, the electronics of the camera system 600 may be implemented as one or more integrated circuits. For example, an application specific integrated circuit (ASIC) or system on chip (SOC) may be used to implement the camera system 600.

In one example, the camera system 600 may comprise the DRAM circuit 86, a processor/camera chip (or circuit) 602, a block (or assembly) 604 having a block 606 and one or more blocks (or circuits) 608, a block (or circuit) 610, a block (or circuit) 612, a block (or circuit) 614, a block (or circuit) 616, a block (or circuit) 618, a block (or circuit) 620, a block (or circuit) 622 and a block (or circuit) 624. The processor/camera circuit 602 generally incorporates hardware and/or software/firmware that may be configured to implement the processors and circuits described above in connection with FIGS. 1-8. The circuits 86 and 604-624 may be connected to the processor/camera circuit 602.

In various embodiments, the processor/camera circuit 602 may comprise one or more processors 626 (e.g., ARM, etc.), one or more coprocessors 628, a block (or circuit) 630, a block (or circuit) 632, a block (or circuit) 634, a block (or circuit) 636, a block (or circuit) 638, a block (or circuit) 640, a block (or circuit) 642, a block (or circuit) 644, a block (or circuit) 646 and a block (or circuit) 648. The circuits 626 through 648 may be connected to each other using one or more buses, traces, protocols, etc.

The circuit 604 may implement a lens and sensor assembly. The lens and sensor assembly 604 is shown connected to the processor/camera circuit 602. In some embodiments, the lens and sensor assembly 604 may be a component of the processor/camera circuit 602 (e.g., a SoC component). In some embodiments, the lens and sensor assembly 604 may be a separate component from the processor/camera circuit 602 (e.g., the lens and sensor assembly may be an interchangeable component compatible with the processor/camera circuit 602). In some embodiments, the lens and sensor assembly 604 may be part of a separate camera connected to the processing portion of the circuit 602 (e.g., via a video cable, a high definition media interface (HDMI) cable, a universal serial bus (USB) cable, an Ethernet cable, or wireless link). The lens and sensor assembly 604 may comprise other components (not shown). The number, type and/or function of the components of the lens and sensor assembly 604 may be varied according to the design criteria of a particular application.

The block 606 may implement a lens 606. The lens 606 may capture and/or focus light input received from the environment near the camera 600. The lens 606 may capture and/or focus light for the circuit 608. The lens 606 may be implemented as an optical lens. The lens 606 may provide a zooming feature and/or a focusing feature. The lens and sensor assembly 604 may be implemented with additional circuitry (e.g., motors) to adjust a direction, zoom and/or aperture of the lens 606. The lens 606 may be directed, tilted, panned, zoomed and/or rotated to provide a targeted view of the environment near the camera 600.

The circuit 608 may implement an image sensor. The image sensor 608 may receive light from the lens 606. The image sensor 608 may be configured to transform the received focused light into digital data (e.g., bitstreams). In some embodiments, the image sensor 608 may perform an analog to digital conversion. For example, the image sensor 608 may perform a photoelectric conversion of the focused light received from the lens 606. The image sensor 608 may present the converted image data as a color filter array (CFA) formatted bitstream. The processor/camera circuit 602 may transform the bitstream into video data, video files and/or video frames (e.g., human-legible content).

The circuit 610 may be a microphone for capturing audio. The circuit 612 may be an audio codec for recording audio in a particular format. The circuit 614 may be a speaker for playing audio.

The circuit 616 may implement a nonvolatile memory (e.g., NAND flash memory, NOR flash memory, etc.). The circuit 618 may implement a removable media 618 (e.g., secure digital media (SD), secure digital extended capacity media (SDXC), etc.). The circuit 620 may implement one or more serial communication channels 620 (e.g., RS-485, RS-232, etc.). The circuit 622 may implement one or more universal serial bus (USB) hosts 622 and/or USB interfaces. The circuit 624 may implement wireless interface for communicating with a user device (e.g., a smart phone, a computer, a tablet computing device, cloud resources, etc.). In various embodiments, the wireless interface 624 and/or the USB Host 622 may be configured for communicating with a camera controller wirelessly. In the embodiment shown, the circuits 604-624 are implemented as components external to the processor/camera circuit 602. In some embodiments, the circuits 604-624 may be components on-board the processor/camera circuit 602.

The circuit 630 may be a digital signal processing (DSP) module. In some embodiments, the circuit 630 may implement separate image DSP and video DSP modules. The DSP module 630 may be configured to process digital signals. The DSP module 630 may comprise an image digital signal processor (IDSP), a video digital signal processor DSP (VDSP) and/or an audio digital signal processor (ADSP). The DSP module 630 may be configured to receive information (e.g., pixel data values captured by the image sensor 608) from the circuit 636. The DSP module 630 may be configured to determine the pixel values (e.g., RGB, YUV, luminance, chrominance, etc.) from the information received from the sensor input 636. The DSP module 630 may be further configured to support or provide a sensor RGB to YUV raw image pipeline to improve image quality, bad pixel detection and correction, demosaicing, white balance, color and tone correction, gamma correction, adjustment of hue, saturation, brightness and contrast adjustment, chrominance and luminance noise filtering.

The circuit 632 may be a storage interface. The storage interface 632 may be configured to manage one or more types of storage and/or data access. In one example, the storage interface 632 may implement a direct memory access (DMA) engine and/or a graphics direct memory access (GDMA). In another example, the storage interface 632 may implement a secure digital (SD) card interface (e.g., to connect to the removable media 618).

The circuit 634 may implement a local memory system (e.g., cache, fast random access memory, etc.). In various embodiments, programming code (e.g., executable instructions for controlling various processors and encoders of the processor/camera circuit 602) may be stored in one or more of the memories (e.g., the DRAM circuit 86, the NAND 616, etc.). When executed by the processors 626, the programming code generally causes one or more components in the processor/camera circuit 602 to configure video synchronization operations and start video frame processing operations. The resulting compressed video signal may be presented to the storage interface 632, the video output 646 and/or the communication module 648. The storage interface 632 may transfer program code and/or data between external media (e.g., the DRAM circuit 86, the NAND 616, the removable media 618, etc.) and the local (internal) memory system 634.

The circuit 636 may implement a sensor input (or interface). The sensor input 636 may be configured to send/receive data to/from the image sensor 608. In one example, the sensor input 636 may comprise an image sensor input interface. The sensor input 636 may be configured to transmit captured images (e.g., light data) from the image sensor 608 to the DSP module 630 and/or the processors 626. The data received by the sensor input 636 may be used by the DSP 630 to determine a luminance (Y) and chrominance (U and V) values from the image sensor 608. The sensor input 636 may provide an interface to the lens and sensor assembly 604. The sensor input 636 may enable the processor/camera circuit 602 to capture image data from the lens and sensor assembly 604.

The circuit 638 may implement one or more control interfaces including but not limited to an inter device communication (IDC) interface, an inter integrated circuit ($I^2C$) interface, a serial peripheral interface (SPI), and a pulse width modulation (PWM) interface. The control interface 638 may be configured to generate signals (e.g., IDC/I2C, STEPPER, IRIS, AF/ZOOM/TILT/PAN, etc.) for controlling the lens and sensor assembly 604. The signal IRIS may be configured to adjust an iris for the lens and sensor assembly 604. The control interface 638 may enable the processor/camera circuit 602 to control the lens and sensor assembly 604.

The circuit 640 may implement an audio interface (e.g., an I²S interface, etc.). The audio interface 640 may be configured to send/receive audio data. In one example, the audio interface 640 may implement an audio inter-IC sound (I²S) interface. The audio interface 640 may be configured to send/receive data in a format implemented by the audio codec 612. The circuit 642 may implement a clock circuit including but not limited to a real time clock (RTC), a watchdog timer (WDT), and/or one or more programmable timers.

The circuit 644 may implement an input/output (I/O) interface. The I/O interface 644 may be configured to send/receive data. The data sent/received by the I/O interface 644 may be miscellaneous information and/or control data. In one example, the I/O interface 644 may implement a general purpose input/output (GPIO) interface. In another example, the I/O interface 644 may implement an analog-to-digital converter (ADC) module and/or digital-to-analog converter (DAC) module. In yet another example, the I/O interface 644 may implement an infrared (IR) remote interface. In still another example, the I/O interface 644 may implement one or more synchronous data communications interfaces (IDC SPI/SSI).

The circuit 646 may be a video output module. The video output module 646 may be configured to send video data. For example, the camera 600 may be connected to an external device (e.g., a TV, a monitor, a laptop computer, a tablet computing device, etc.). The video output module 646 may implement a high-definition multimedia interface (HDMI), an LCD/TV/Parallel interface and/or a DisplayPort interface. The video data may be presented in one or more formats (e.g., PAL, NTSC, VGA, WVGA, QVGA, SD, HD, Ultra HD, 4K, etc.).

The circuit 648 may be a communication module. The communication module 648 may be configured to send/receive data. The data sent/received by the communication module 648 may be formatted according to a particular protocol (e.g., Bluetooth, USB, Wi-Fi, UART, etc.). In one example, the communication module 648 may implement a secure digital input output (SDIO) interface. The communication module 648 may include support for wireless communication by one or more wireless protocols such as Bluetooth®, ZigBee, Institute of Electrical and Electronics Engineering (IEEE) 802.11, IEEE 802.15, IEEE 802.15.1, IEEE 802.15.2, IEEE 802.15.3, IEEE 802.15.4, IEEE 802.15.5, IEEE 802.20, GSM, CDMA, GPRS, UMTS, CDMA2000, 3GPP LTE, 4G/HSPA/WiMAX and/or SMS. The communication module 648 may also include support for communicating using one or more of the universal serial bus protocols (e.g., USB 1.0, 2.0, 3.0, etc.). The processor/camera circuit 602 may also be configured to be powered via a USB connection. However, other communication and/or power interfaces may be implemented accordingly to meet the design criteria of a particular application.

The functions and structures illustrated in the diagrams of FIGS. 1 to 8 may also be implemented, designed, modeled, emulated, and/or simulated using one or more of a conventional general purpose processor, digital computer, microprocessor, microcontroller, distributed computer resources, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines, virtual machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus configured to perform image processing in a machine vision system comprising:
a first circuit configured to traverse a link list of connected components forming an object in an image being processed in said machine vision system, wherein (i) said link list of connected components is stored in a component table associated with said image and comprises object IDs and link pointers for each component of said object, (ii) said link pointers identify links between each component from a current leaf component to a root component of said object, (iii) said object comprises a plurality of pixels of said image, and (iv) each of said connected components comprises one or more pixels of said image belonging to said object; and
a second circuit configured to (i) modify at least the link pointer associated with said current leaf component to point to said root component of said object instead of a next component between said current leaf component and said root component of said object by generating a control signal to control replacement of at least an object ID of a next connected leaf component in said link pointer of said current leaf component with the object ID of said root component of said object, and (ii) stop said first circuit from driving an access to said component table when said second circuit is modifying a link pointer of said component table.

2. The apparatus according to claim 1, wherein said link list of connected components is generated during application of connected component labeling to said image being processed.

3. The apparatus according to claim 1, further comprising a multiplexer circuit configured to select between original data of said link list and modified data from said second circuit in response to said control signal generated by said second circuit.

4. The apparatus according to claim 3, wherein:
said second circuit comprises a first-in-first-out (FIFO) memory configured to store a queue of leaf component information of said link list traversed by said first circuit; and
said second circuit generates said modified data using said queue of said leaf component information.

5. The apparatus according to claim 1, wherein said second circuit is configured to modify less than all of the link pointers of said link list of connected components of said object.

6. The apparatus according to claim 1, wherein said second circuit is configured to modify at least two of the link pointers starting with said current leaf component of said link list being traversed.

7. The apparatus according to claim 1, wherein said first circuit and said second circuit are implemented solely in hardware.

8. The apparatus according to claim 1, wherein said first circuit and said second circuit are part of a processor of a system on chip.

9. A method of reducing latency in connected component labeling operations on images in a machine vision system comprising:
traversing a link list of connected components forming an object in an image being processed in said machine vision system, wherein (i) said link list of connected components is stored in a component table associated with said image and comprises object IDs and link pointers for each component of said object, (ii) said link pointers identify links between each component from a current leaf component to a root component of said object, (iii) said object comprises a plurality of pixels of said image, and (iv) each of said connected components comprises one or more pixels of said image belonging to said object; and
modifying at least the link pointer associated with said current leaf component to point to said root component of said object instead of a next component between said current leaf component and said root component of said object, wherein modifying the link pointer associated with the current leaf component to point to said root component of said object comprises replacing at least an object ID of a next connected leaf component in the link pointer of the current leaf component with the object ID of said root component of said object in response to a control signal, and preventing an access to said component table when a link pointer of said component table is being modified.

10. The method according to claim 9, further comprising generating said link list of connected components by applying a connected component labeling technique to said image being processed.

11. The method according to claim 9, further comprising:
selecting between original data from the link list being traversed and modified data for storage in said component table associated with said image being processed.

12. The method according to claim 11, further comprising:
storing a queue of leaf component information of the link list being traversed in a first-in-first-out (FIFO) memory; and
generating said modified data using said queue of said leaf component information.

13. The method according to claim 11, wherein less than all of the link pointers of the link list of connected components of the object are modified.

14. The method according to claim 11, wherein at least two of the link pointers starting with the current leaf component of the link list being traversed are modified.

15. The method according to claim 11, wherein traversing said link list of connected components forming the object is performed using a link list traversing logic circuit.

16. The method according to claim 15, further comprising:
preventing said link list traversing logic circuit from accessing said component table when a link pointer of said component table is being modified.

17. The method according to claim 16, further comprising:
using a multiplexer circuit controlled by said control signal to control access by said link list traversing logic circuit to said component table.

18. The method according to claim 9, further comprising:
traversing said link list of connected components forming said object starting at a leaf component;

until said root component of said object is reached, pushing each leaf component ID into a queue of leaf component information of the link list being traversed; and when said root component of said object is reached, popping each leaf component ID from said queue of leaf component information of the link list being traversed and modifying a corresponding link pointer in said component table to point to said root component of said object.

\* \* \* \* \*

UNITED STATES PATENT AND TRADEMARK OFFICE
CERTIFICATE OF CORRECTION

Page 1 of 1

PATENT NO. : 11,194,474 B1
APPLICATION NO. : 16/834236
DATED : December 7, 2021
INVENTOR(S) : Yen-Hsu Shih It is certified that error appears in the above-identified patent and that said Letters Patent is hereby corrected as shown below:

On the Title Page

The Assignee should appear as follows:
Ambarella International LP
Santa Clara, CA (US)

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*